United States Patent [19]
Heidemann et al.

[11] Patent Number: 5,229,599
[45] Date of Patent: Jul. 20, 1993

[54] AMPLIFYING CIRCUIT ARRANGEMENT WITH A SIGNAL SOURCE HAVING A HI-OHMIC OUTPUT IMPEDANCE

[75] Inventors: Rolf Heidemann, Tamm; Klaus Braun, Kusterdingen, both of Fed. Rep. of Germany

[73] Assignee: Alcatel N.V., Amsterdam, Netherlands

[21] Appl. No.: 906,286

[22] Filed: Jun. 29, 1992

[30] Foreign Application Priority Data

Jun. 27, 1991 [DE] Fed. Rep. of Germany ....... 4121273
Dec. 12, 1991 [DE] Fed. Rep. of Germany ....... 4140975

[51] Int. Cl.$^5$ ............................................. H01J 40/14
[52] U.S. Cl. .................... 250/214 A; 359/189
[58] Field of Search ............. 250/214 A, 214 R; 359/189; 330/59

[56] References Cited

U.S. PATENT DOCUMENTS 4,647,762  3/3987  Chown ...................... 250/214 A
5,010,588  4/1991  Gimlett ...................... 330/59
5,023,951  6/1991  Kahn ........................ 330/59

FOREIGN PATENT DOCUMENTS 0372742  6/1990  European Pat. Off. .
0433646  6/1991  European Pat. Off. .

OTHER PUBLICATIONS

Geisler, J. A. et al., "Optical Fibres" (EPO Applied Technology Series; vol. 5), 1986, Part III, Chapter III Optical Fibre Receivers pp. 437–526.

Primary Examiner—David C. Nelms
Assistant Examiner—T. Davenport
Attorney, Agent, or Firm—Spencer, Frank & Schneider

[57] ABSTRACT

A circuit arrangement includes a signal source having a high-ohmic complex output impedance, an amplifier having a low-ohmic input impedance for receiving a signal from the signal source, and a tuned quarter wavelength circuit for matching the signal source to the amplifier.

17 Claims, 2 Drawing Sheets

AMPLIFYING CIRCUIT ARRANGEMENT WITH A SIGNAL SOURCE HAVING A HI-OHMIC OUTPUT IMPEDANCE

CROSS REFERENCE TO RELATED APPLICATION

This application claims the priority of application Ser. No. P 41 21 273.8, filed Jun. 27, 1991, and application Ser. No. P 41 40 975.2, filed Dec. 12, 1991, both in the Federal Republic of Germany, the subject matter of which is incorporated herein by reference.

BACKGROUND OF THE INVENTION

1. Field of the Invention

The invention relates to an amplifying circuit arrangement including a signal source having a high-ohmic output impedance and a low-ohmic amplifier.

2. Background Information

Such circuit arrangements serve, for example, in optical receivers to convert optical signals into electrical signals and to preamplify these electrical signals.

In optical transmission systems having an optical receiver which is highly sensitive over a relatively narrow frequency range and includes a light sensitive component (photodiode) and an amplifier connected to its output, the performance level of an optical receiving signal to be processed by an optical receiver can vary greatly. The receiver must therefore be able to detect without errors very low as well as very high light levels. The lower limit is called receiver sensitivity. It is essentially a function of the noise characteristics of the detector element which is configured as a light sensitive component. The receiver sensitivity further depends on the circuitry of the amplifier employed within the optical receiver.

The publication by J. A. Geisler, entitled "Optical Fibres" (EPO Applied Technology Series; Volume 5), 1986, Part III, Chapter III, pages 437-526, discloses a multitude of optical receivers. The optical receivers described there exhibit complicated circuitry for the amplifier connected to the output of the light sensitive component, with the amplifier being realized as a high impedance amplifier or as a transimpedance amplifier. If one desires a large dynamic range, optical receivers including a transimpedance amplifier are employed with preference. Such an optical receiver including a transimpedance amplifier is disclosed, for example in DE-A1 3,938,097. Transimpedance amplifiers have the highest possible impedance at their input and can be used over a broad frequency range. They perform the function of a current/voltage converter which converts the electrical current from the light sensitive component into a voltage. The drawback of such a type of amplifier is a resulting deterioration of the signal to noise ratio which brings with it a limitation of the receiver sensitivity.

Prior art broadband amplifying circuit arrangements are used, for example, for optical broadband receivers in optical CATV (cable television) and digital communication systems. A cost-effective optical broadband receiver for analog amplitude modulated signals having a band range from 50 MHz to 550 MHz, is disclosed in European Patent EP 0,372,742 A2. The prior art receiver comprises a light sensitive component, which, for impedance matching, is connected to a broadband, low-ohmic amplifier by way of a transmitter.

The drawback of the prior art receiver is that the light sensitive component, despite impedance matching, demonstrates a poor output reflection factor which causes severe harmonic distortion in the higher order harmonics in the amplifier.

SUMMARY OF THE INVENTION

It is therefore the object of the invention to create an amplifying circuit arrangement of increased sensitivity in which during the amplification of broadband signals nonlinear distortions, such as distortions of the second order of harmonics, can be prevented to a large extent.

This object is attained by matching the signal source to the low-ohmic amplifier by way of a timed, quarter wavelength ($\lambda/4$) circuit.

Advantageous features will become apparent from the following description of the preferred embodiments taken with the drawings.

BRIEF DESCRIPTION OF THE DRAWINGS

Embodiments of the invention are described hereinafter by way of FIGS. 1 to 5 in which.

DETAILED DESCRIPTION OF THE PREFERRED EMBODIMENTS

In the first embodiment the circuit arrangement is used in a narrowband optical receiver. A photo diode serves as light sensitive component in the optical receiver. The photodiode has a capacitance of, for example, $C \approx 1pF$ and an output impedance in the $k\Omega$ range. Due to the tuned $\lambda/4$ circuits, the signal from the photodiode is matched to an amplifier having an input impedance of, for example $Z_e = 50\Omega$.

The optical receiver according to the first embodiment of the invention is particularly suitable for use in a relatively narrow frequency range, for example, in the mobile radio system DECT: 1800-1900 MHz. Moreover, the optical receiver is selective. As a result, noise signals, which occur beyond the frequency sensitivity range are suppressed.

An advantageous modification of the receiver is that the frequency range can be varied by way of an optional tuning capacitor.

If an $n \cdot \lambda/4$ circuit ($n = 1, 3, 5, \ldots$, i.e., odd) is used for matching, the optical receiver is tuned to a plurality of harmonic frequencies.

Figures 1A, 1B, 1C:
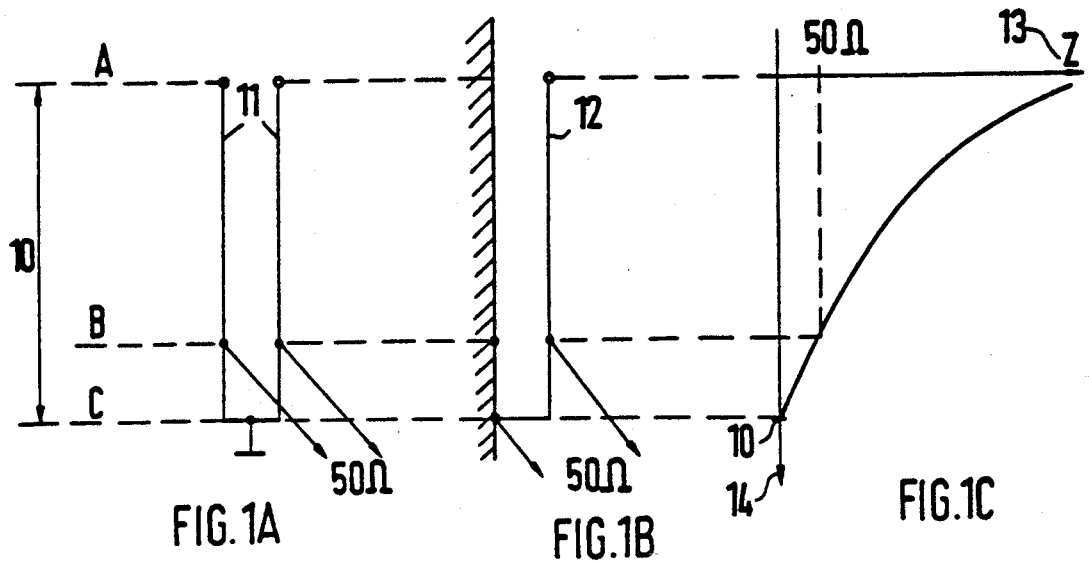
FIGS. 1A, 1B and 1C depict the principle of a $\lambda/4$ circuit and the variation of the characteristic impedance as a function of the length.

FIG. 1A shows an embodiment of the $\lambda/4$ circuit as a parallel wire 11 of a certain length 10. Another embodiment of the $\lambda/4$ circuit is shown in FIG. 1B which depicts a stripline embodiment of the $\lambda/4$ circuit where the $\lambda/4$ circuit is composed of a single line 12 separated from a ground plane.

FIG. 1C shows a curve of the impedance 13 over the length 14 of the line(s) of the $\lambda/4$ circuit. FIGS. 1A, 1B and 1C have reference lines A, B and C in common.

Reference line A constitutes the beginning of the $\lambda/4$ circuit. At this point, the impedance of the $\lambda/4$ circuit is high. Reference line B describes the point in the λ/4 circuit at which the λ/4 circuit has a characteristic impedance of 50 Ω. At this point, an amplifier is connected which has an input impedance of 50 Ω. Reference line C represents the point in the λ/4 circuit at which the λ/4 circuit is short-circuited. The distance between the points marked by reference lines A and C is the length 10 of the λ/4 circuit.

Reference lines A, B and C, and other reference numerals, appear in several of the figures. The same reference numerals or reference lines hereinafter will designate the same elements or points in the optical receiver according to the invention.

Figures 2, 3:
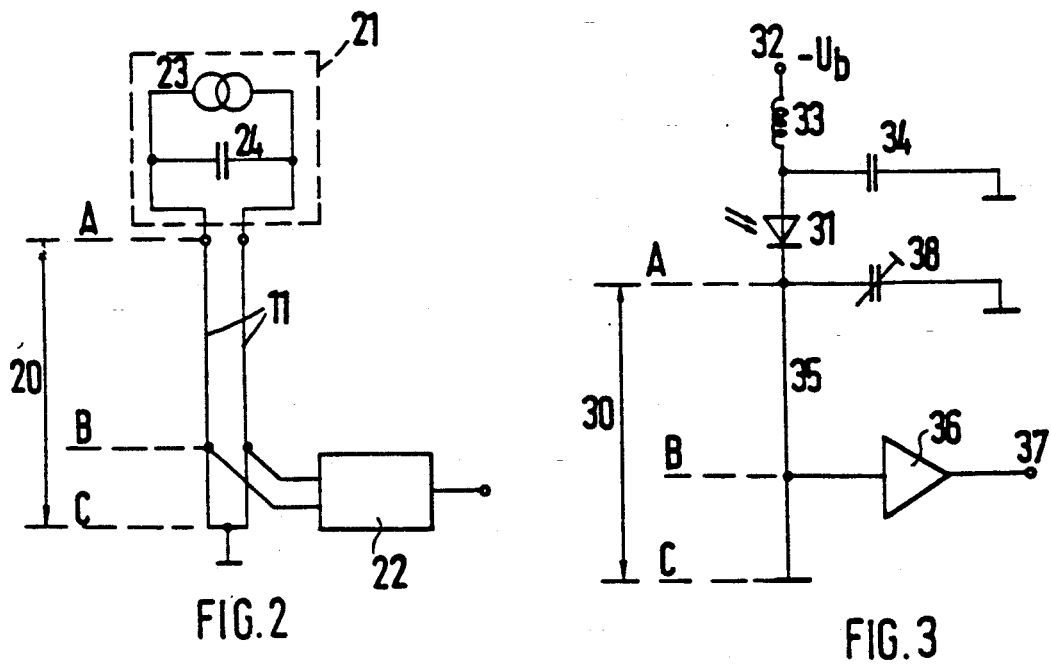
FIG. 2 depicts a $\lambda/4$ circuit including an equivalent circuit diagram for the photodiode.
FIG. 3 is a basic circuit diagram of the first embodiment.

In FIG. 2, a photodiode 21, whose equivalent circuit is represented by the circuit in the box 21, has a high output impedance (at reference line A) and in the equivalent circuit diagram it may be considered as a current source 23 including a parallel connected capacitor 24. The λ/4 circuit is connected to the output of photodiode 21.

For a determination of the length 20 of the λ/4 circuit, it must be considered that capacitor 24 causes the λ/4 circuit to b capacitively shortened. Length 20 is thus shorter than the length 10 of a theoretically determined load-free λ/4 circuit.

The lines 11 having the length 20 are tapped at the location of reference line B, that is, at the point where the λ/4 circuit has an impedance equal to the input impedance of the amplifier, for example, 50 Ω. At this point, amplifier 22 is matched without loss.

FIG. 3 is a basic circuit diagram for the optical receiver according to the invention. A photodiode 31 receives light signals through a light waveguide (not shown) that is part of an optical transmission system.

The anode of photodiode 31 is connected by way of a choke coil 33 with the negative pole of a voltage supply source 32. Choke coil 33 serves to decouple high frequency signal components in that it constitutes a barrier for alternating currents of higher frequencies, while lower frequencies or a direct current ca pass easily.

The anode of the photodiode is also connected with a capacitor 34 which in turn is connected to ground potential. Thus the anode is connected to ground for high frequencies while for direct current it lies at the negative potential of voltage supply source 32. Due to its function, capacitor 34 is defined as a blocking capacitor.

The cathode of photodiode 31 is connected directly with a λ/4 circuit 35 of a length 30. The λ/4 circuit is tapped at the location at which the characteristic impedance of the λ/4 circuit is 50 Ω. This location corresponds to reference line B in FIG. 3. This is where a low noise amplifier 36 having an input impedance of 50 Ω is connected. A voltage that is proportional to the photocurrent generated by photodiode 31 is present at the output 37 of amplifier 36.

The frequency range of the optical receiver can be varied with an additional circuit variation. This variation is present if a tuning capacitor 38 which itself is connected to ground potential is connected to the cathode of photodiode 31. This (loss-free, no noise) tuning capacitor 38 permits the electrically effective length and thus the resonant frequency of the λ/4 circuit to be set. The capacitance is connected in parallel with the capacitance 24 of the photodiode. If the λ/4 circuit is a n·λ/4 circuit (n=1, 3, 5, ...), the receiver is tuned to a harmonic series of frequencies. By connecting tuning capacitors 38 (in addition to photodiode 31) it is possible to set almost any desired receiving frequency (e.g. 900 MHz for CT1 and 1900 MHz for DECT).

The second embodiment relates to an advantageous feature for matching the impedance of a signal source having a high-ohmic complex output impedance to a low-ohmic amplifier of a broadband, amplifying circuit arrangement.

Figure 4:
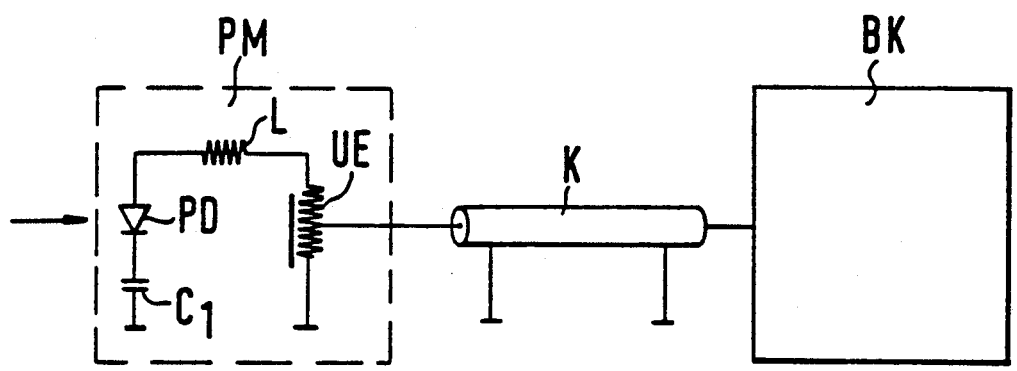
FIG 4 is a second embodiment of the invention.

In the second embodiment an optical broadband receiver is depicted as the broadband amplifying circuit arrangement in FIG. 4. The broadband receiver E depicted comprises a PIN module PM, a λ/4 circuit K and a low-ohmic broadband amplifier BK. In the PIN module a PIN photodiode is arranged as light sensitive component PD for converting an optical signal into an electrical signal. Light-sensitive component PD is connected to a transformer UE by way of an inductance L. Inductance L serves to raise the frequency response of the converted signal toward higher frequencies. In transformer UE, the first part of impedance matching takes place between PIN photodiode PD and low-ohmic amplifier BK in a manner known to the person of skill in the art and as described, for example, in European Patent EP 0,372,742 A2.

The transformation ratio can be derived from the input impedance of the low-ohmic amplifier BK and the complex internal resistance of PIN photodiode PD for each frequency band to be received. Impedance matching in a transmission band having a lower limit frequency $f_{G1}=40$ MHz and an upper limit frequency $f_{G2}=550$ MHz, a dynamic impedance $Z_D=1$ Kohm of the PIN photodiode assumed for this band, and an input impedance $Z_E=75$ ohm of the low-ohmic amplifier, can be obtained, for example, with a transformation ratio of 1 to 3.6. The transformer UE depicted is configured as an autotransformer. The output signal of the PIN module PM is present at its tap. The operating point of the PIN photodiode is adjusted by way of a capacitor $C_1$ in a manner known to the person of skill in the art.

A known symmetric push-pull amplifier in the form of a module with which broadband analog signals can be amplified in cable TV systems is provided as the low-ohmic amplifier BK. Such amplifiers are sold, for example, by the Valvo company, under the name of BGY 584 A, BGY 585 A as broadband amplifier modules in push-pull connection for cable television systems. According to Data Sheet 6.88, the input impedance is $Z_E=75$ ohm.

Such push-pull amplifiers are generally provided with two symmetrical amplifier branches in each of which the same signal, but phase shifted by 180°, is amplified. Subsequent to amplification, the two phase shifted signals are again brought into phase coincidence. Due to the 180° phase shift in the amplifier branches and the subsequent in-phase combination, non-linear harmonic distortions, such as distortion of the second order and higher, are reduced. Maximum reduction of harmonic distortion is attained when the signal amplitudes in both amplifier branches are equal.

Thus, if there is a mismatch at the input of the push-pull amplifier, the result is different signal amplitudes in the two amplifier branches, and this causes greater harmonic distortion.

It is just this matching of the complex component of the output impedance of the PIN module PM to the input of amplifier BK that is accomplished by the λ/4 circuit. The characteristic impedance $Z_W$ of the λ/4 circuit and the input impedance $Z_E$ of the low-ohmic amplifier should therefore be as close to equal as possible. A deviation of, for example, 5 ohm, in this case, does not yet result in a notioeable deterioration.

If the PIN module PM and the low-ohmic amplifier BK are each constructed as a module, the λ/4 circuit is advantageously configured as a λ/4 line in the form of a microwave coaxial line with detachable connections.

In another modification the λ/4 circuit can be realized as a symmetrical, reversible quadripole circuit. This is particularly indicated if the elements of the PIN module PM and of the low-ohmic amplifier BK are realized in a common integrated circuit.

In a further modification the amplifier BK is configured as an insulated module. In addition to the PIN photodiode and the transformer UE, the λ/4 circuit in this case is also arranged in the form of a quadripole circuit in the PIN module PM. Since for this modification a microwave guide is required as a connection between the PIN module PM and the amplifier module BK, it is advisable to include the length of the line of this microwave guide in the dimensions of the λ/4 circuit so that the complete λ/4 circuit consists of a combination of a quadripole and a piece of the line.

The quadripole circuit may also be arranged ahead of the transformer UE and, in this case, can also assume the function of coil L.

As an integrated embodiment of a λ/4 circuit it is possible to arrange, as an alternative to the quadripole circuit, a λ/4 line which is configured in stripline technology.

Figure 5:
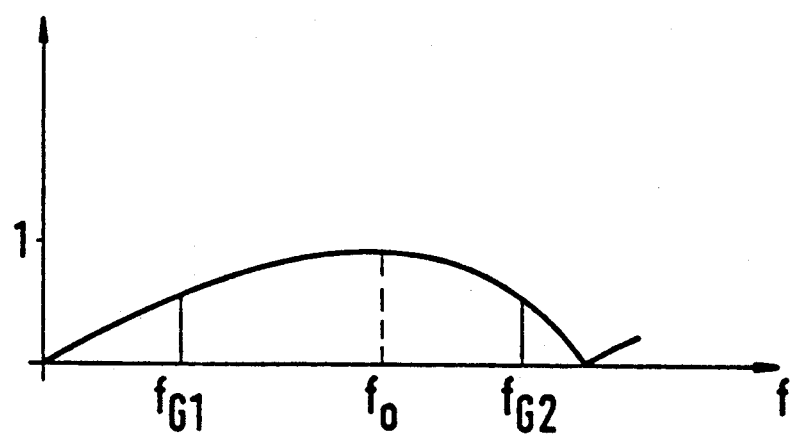
FIG. 5 depicts the reduction of harmonic distortions under the influence of the $\lambda/4$ circuit plotted against the frequency.

In FIG. 5, reduction of the harmonic distortion caused by the λ/4 circuit in a broadband amplifier is plotted against the frequency. The bandwidth is indicated by the two limit frequencies: a lower limit frequency $f_{G1} = 40$ MHz and an upper limit frequency $f_{G2} = 550$ MHz. Maximum reduction of harmonic distortion has been designated 1 and has its highest value at a frequency $f_o$, which corresponds to wavelength $\lambda_0$, to which the λ/4 circuit is tuned.

In the embodiment the λ/4 line is tuned in such a way that harmonic distortion is maximally suppressed at a frequency $f_o = 375$ MHz. The mechanical length $L_m$ of the λ/4 line in this case is obtained from the equation $$L_m = L_o \cdot V \quad (1),$$

in which $L_o$ is the electrical length, with the value of the dielectric constant of the λ/4 line being reflected in shortening factor V, which, in the embodiment, is V=0.7. The designation $$L_o = \frac{c}{f \cdot 4} \quad (2)$$

in combination with Equation (1) results in a mechanical length of $L_m = 140$ mm for frequency $f_o = 375$ MHz, a shortening factor V=0.7 and $c = 3 \cdot 10^{8} m_s$. The electrical length is $L_0 = 200$ mm.

Since harmonic distortion in this type of arrangement increases with increasing frequency and maximal reduction of harmonic distortion, as is evident in FIG. 2, occurs only for the tuned frequency, and suppression of harmonic distortion decreases with increasing distance from the tuned frequency $f_o$, the λ/4 circuit is not tuned to the center frequency of the band but to a frequency which lies in the higher-frequency half of the band. This makes possible a compromise between a maximum selective reduction of the harmonic distortion at the upper limit frequency $f_{G2}$ and a maximum integral reduction of the harmonic distortion during tuning to a center frequency. The λ/4 circuit is tuned to an advantageous value, depending on what is required and the configuration of the receiver E.

In addition to PIN photodiodes configured as light-sensitive components, other photodiodes, such as, for example, avalanche photodiodes, or, for example, receiver connections of microwave antennas, may also be used as the signal source. Particularly advantageous is the arrangement of the invention in purely passive optical receiver modules, i.e., in receiver modules that do not contain any active amplifying semiconductor components.

It will be understood that the above description of the present invention is susceptible to various modifications, changes and adaptations, and the same are intended to be comprehended within the meaning and range of equivalents of the appended claims.

What is claimed is:

1. A circuit arrangement comprising:
   a signal source having a high-ohmic complex output impedance;
   an amplifier having a low-ohmic input impedance for receiving a signal from the signal source; and
   a tuned quarter wavelength circuit for matching the signal source to the amplifier.

2. The circuit arrangement according to claim 1, wherein the signal source is a light sensitive component disposed in an optical receiver.

3. An optical receiver having the circuit arrangement according to claim 2, wherein the light sensitive component is connected to an open end of the quarter wavelength circuit.

4. An optical receiver having the circuit arrangement according to claim 1, wherein the quarter wavelength circuit is short-circuited at one end.

5. An optical receiver having the circuit arrangement according to claim 1, wherein the amplifier has an input impedance of 50 ohms and is connected to that point in the quarter wavelength circuit at which the characteristic impedance of the quarter wavelength circuit is 50 ohms.

6. An optical receiver having the circuit arrangement according to claim 1, wherein the amplifier has an input impedance of 50 ohms.

7. An optical receiver having the circuit arrangement according to claim 1 and having a frequency sensitivity range further comprising a tuning capacitor operatively coupled to an open end of the quarter wavelength circuit, wherein the frequency sensitivity range can be varied by way of the tuning capacitor.

8. An optical receiver having the circuit arrangement according to claim 1, wherein the quarter wavelength circuit has a length of n quarter wavelengths, where n is an odd integer.

9. The circuit arrangement according to claim 1, further comprising a transformer operatively coupled between the amplifier and the quarter wavelength circuit, wherein the wavelength to which the quarter wavelength circuit is tuned is in a band range of a signal from the signal source.

10. The circuit arrangement according to claim 9, wherein the wavelength lies within a half of the band range that has shorter wavelengths.

11. The circuit arrangement according to claim 9, wherein the quarter wavelength circuit comprises a quarter wavelength microwave line.

12. The circuit arrangement according to claim 11, wherein the signal source and the transformer are disposed in a module, said module being detachably connected by way of the quarter wavelength microwave line to the amplifier which is disposed in a separate module.

13. The circuit arrangement according to claim 9, wherein the input impedance of the amplifier and the characteristic impedance of the quarter wavelength circuit are the same.

14. The circuit arrangement according to claim 9, wherein the characteristic impedance of the quarter wavelength circuit is 750 ohms.

15. The circuit arrangement according to claim 9, wherein an upper limit frequency of the band range is greater than 500 MHz.

16. The circuit arrangement according to claim 9, wherein the signal source is an analog signal source.

17. An optical broadband receiver having the circuit arrangement according to claim 9, wherein the signal source is configured as a light-sensitive component.

* * * * *